(12) United States Patent
Kim et al.

(10) Patent No.: US 11,527,550 B2
(45) Date of Patent: Dec. 13, 2022

(54) MEMORY ARRAY AND A METHOD USED IN FORMING A MEMORY ARRAY

(71) Applicant: Micron Technology, Inc., Boise, ID (US)

(72) Inventors: Changhan Kim, Boise, ID (US); Richard J. Hill, Boise, ID (US); John D. Hopkins, Meridian, ID (US); Collin Howder, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 17/177,357

(22) Filed: Feb. 17, 2021

(65) Prior Publication Data

US 2021/0167089 A1    Jun. 3, 2021

Related U.S. Application Data

(62) Division of application No. 16/179,572, filed on Nov. 2, 2018, now Pat. No. 10,937,798.

(51) Int. Cl.
*H01L 27/11582* (2017.01)
*H01L 27/11524* (2017.01)
(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ......... H01L 27/11582; H01L 29/40117; H01L 27/11565; H01L 27/11524; H01L 29/40114; H01L 27/11556; H01L 27/1157; H01L 21/0217; H01L 21/02164; H01L 21/02326; H01L 21/31111; H01L 21/0223; H01L 23/528; H01L 21/3115; H01L 29/513; H01L 29/1037; H01L 23/5226; H01L 29/0649; H01L 29/518;
(Continued)

(56) References Cited

U.S. PATENT DOCUMENTS 9,553,100 B2    1/2017  Kamiya et al.
9,786,682 B1 *  10/2017 Lee .................... H01L 27/1157
(Continued)

FOREIGN PATENT DOCUMENTS

WO    WO PCT/US2019/057139    2/2020
WO    WO PCT/US2019/057139    4/2021

*Primary Examiner* — Mouloucoulaye Inoussa
(74) *Attorney, Agent, or Firm* — Wells St. John P.S.

(57) ABSTRACT

A memory array comprises a vertical stack comprising alternating insulative tiers and wordline tiers. The wordline tiers comprise gate regions of individual memory cells. The gate regions individually comprise part of a wordline in individual of the wordline tiers. Channel material extends elevationally through the insulative tiers and the wordline tiers. The individual memory cells comprise a memory structure laterally between the gate region and the channel material. Individual of the wordlines comprise opposing laterally-outer longitudinal edges. The longitudinal edges individually comprise a longitudinally-elongated recess extending laterally into the respective individual wordline. Methods are disclosed.

13 Claims, 12 Drawing Sheets

(51) Int. Cl.
  *H01L 27/1157* (2017.01)
  *H01L 27/11556* (2017.01)
  *H01L 21/28* (2006.01)

(52) U.S. Cl.
  CPC .. *H01L 27/11556* (2013.01); *H01L 29/40114* (2019.08); *H01L 29/40117* (2019.08)

(58) Field of Classification Search
  CPC ......... H01L 27/11568; H01L 21/76224; H01L 29/66833; H01L 21/30604; H01L 29/36
  USPC ......... 257/321, 324, 315, E29.309, E21.423, 257/E21.09, E29.262; 438/478, 269, 591
  See application file for complete search history.

(56) References Cited

U.S. PATENT DOCUMENTS

| | | | |
|---|---|---|---|
| 9,806,089 B2 | 10/2017 | Sharangpani et al. | |
| 2009/0321813 A1* | 12/2009 | Kidoh | H01L 27/11578 |
| | | | 257/E21.423 |
| 2012/0012920 A1* | 1/2012 | Shin | H01L 29/4234 |
| | | | 257/E29.262 |
| 2012/0092926 A1* | 4/2012 | Whang | H01L 29/66825 |
| | | | 365/185.01 |
| 2013/0148398 A1 | 6/2013 | Baek et al. | |
| 2013/0171788 A1 | 7/2013 | Yang et al. | |
| 2014/0246716 A1* | 9/2014 | Sinha | H01L 29/78642 |
| | | | 257/315 |
| 2015/0041879 A1* | 2/2015 | Jayanti | H01L 29/16 |
| | | | 438/269 |
| 2015/0060993 A1 | 3/2015 | Lee et al. | |
| 2015/0069494 A1 | 3/2015 | Makala et al. | |
| 2015/0380431 A1* | 12/2015 | Kanamori | H01L 27/11565 |
| | | | 257/324 |
| 2017/0069637 A1* | 3/2017 | Son | H01L 27/11582 |
| 2017/0084623 A1 | 3/2017 | Sharangpani et al. | |
| 2017/0271527 A1* | 9/2017 | Higuchi | H01L 27/1157 |
| 2017/0330893 A1* | 11/2017 | Han | H01L 29/0649 |
| 2018/0083027 A1* | 3/2018 | Yamabe | H01L 27/11582 |
| 2018/0114794 A1* | 4/2018 | Jang | H01L 29/513 |
| 2019/0123060 A1 | 4/2019 | Wang | |
| 2019/0157293 A1* | 5/2019 | Jang | H01L 27/11582 |

\* cited by examiner

MEMORY ARRAY AND A METHOD USED IN FORMING A MEMORY ARRAY

RELATED PATENT DATA

This patent resulted from a divisional application of U.S. patent application Ser. No. 16/179,572, filed Nov. 2, 2018, entitled "A Memory Array And A Method Used In Forming A Memory Array", naming Changhan Kim, Richard J. Hill, John D. Hopkins, and Collin Howder as inventors, the disclosure of which is incorporated by reference.

TECHNICAL FIELD

Embodiments disclosed herein pertain to memory arrays and to methods used in forming a memory array.

BACKGROUND

Memory is one type of integrated circuitry and is used in computer systems for storing data, Memory may be fabricated in one or more arrays of individual memory cells, Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DETAILED DESCRIPTION OF EXAMPLE EMBODIMENTS

Embodiments of the invention encompass methods used in forming an array of transistors and/or memory cells, for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-17 (including FIGS. 1A, 7A, and 14A) which may be considered as a "gate-last" or "replacement-gate" process.

Figure 1:
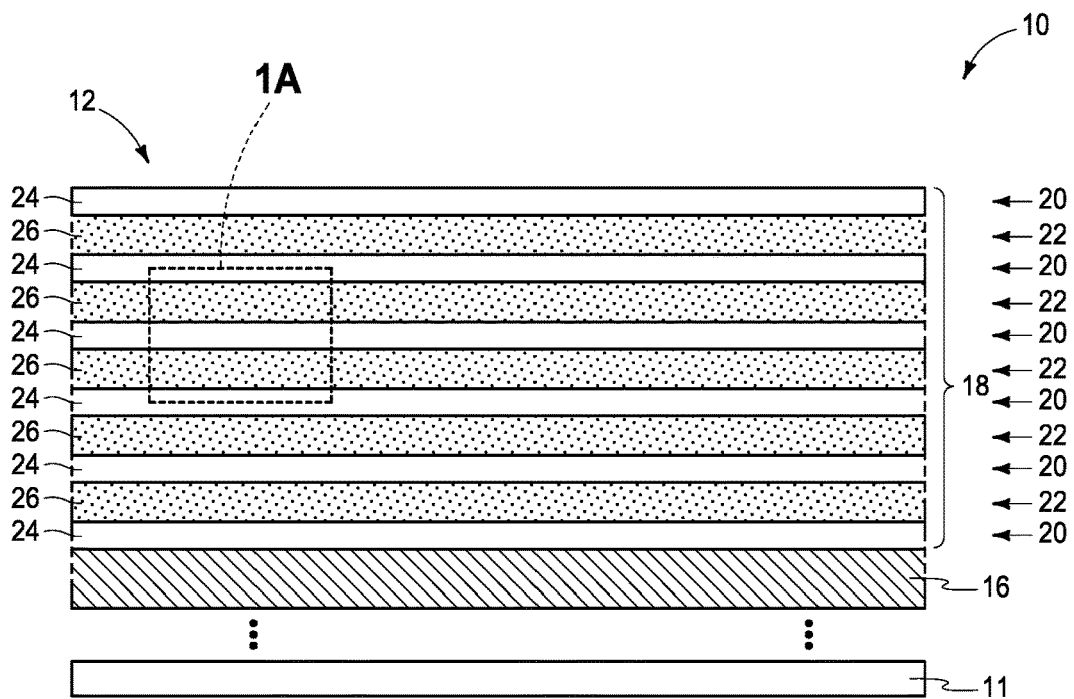
FIG. 1 is a diagrammatic cross-sectional view of a portion of a substrate in process in accordance with an embodiment of the invention.
Figure 1A:
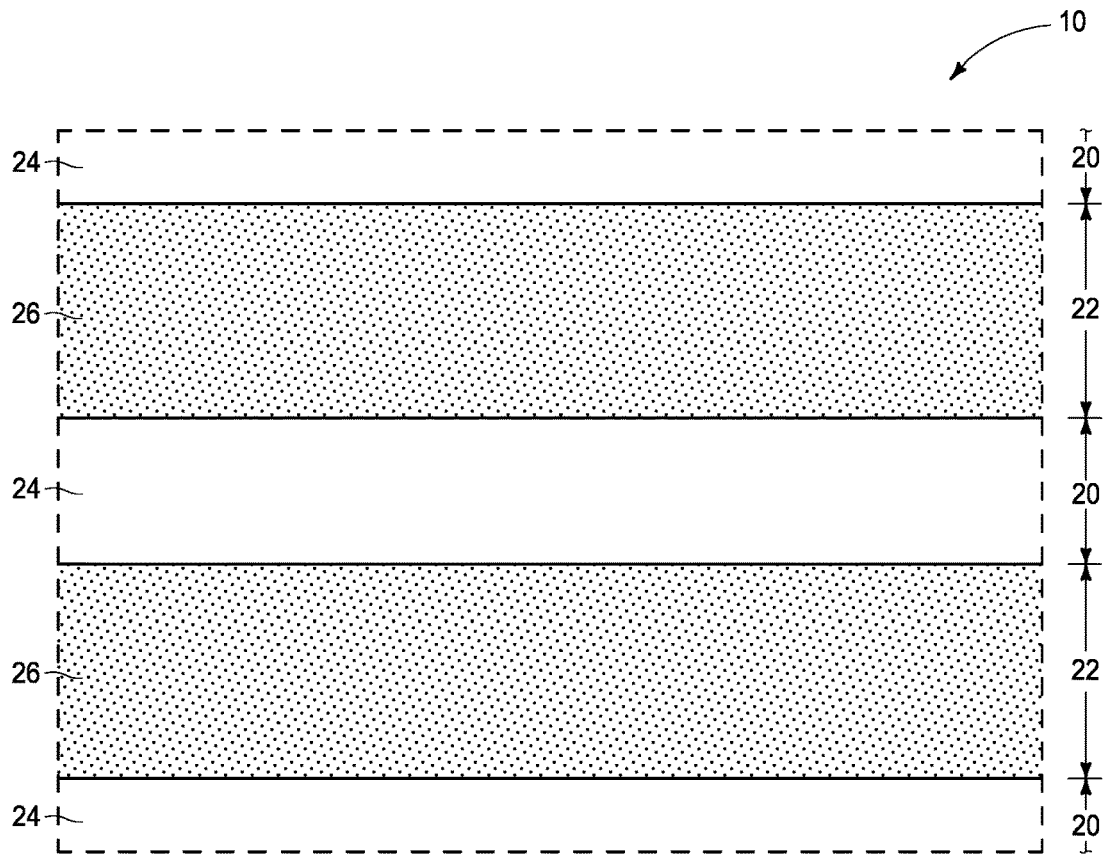
FIG. 1A is an enlarged view of a portion of FIG.

FIGS. 1 and 1A show a substrate construction 10 in process in a method of forming an array 12 of elevationally-extending strings of transistors and/or memory cells (not yet shown). Substrate construction 10 comprises a base substrate 11 having any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 1A-depicted materials. For example, other partially or wholly fabricated components of integrated circuitry may be provided somewhere above, about, or within base substrate 11, Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate construction 10 comprises a stack 18 comprising vertically-alternating insulative tiers 20 and wordline tiers 22 directly above an example conductively-doped semiconductor material 16 (e.g., conductively-doped polysilicon above metal material). Wordline tiers 22 may not comprise conductive material and insulative tiers 20 may not comprise insulative material or be insulative at this point in processing. Only a small number of tiers 20 and 22 is shown, with more likely stack 18 comprising dozens, a hundred or more, etc. of tiers 20 and 22. Wordline tiers 22 comprise first material 26 (e.g., silicon nitride) which may be wholly or partially sacrificial. Insulative tiers 20 comprise second material 24 (e.g., silicon dioxide) that is of different composition from that of first material 26 and which may be wholly or partially sacrificial. In one embodiment, material 26 may be considered as first sacrificial material 26 and in one embodiment material 24 may be considered as second sacrificial material 24. Conductive material 16 may comprise part of control circuitry (e.g., peripheral-under-array circuitry) used to control read and write access to the transistors and/or memory cells that will be formed within array 12, Other circuitry that may or may not be part of peripheral and/or control circuitry (not shown) may be between conductive material 16 and stack 18. For example, multiple vertically-alternating tiers of conductive material and insulative material (not shown) of such circuitry may be below a lowest of the wordline tiers 22 and/or above an uppermost of the wordline tiers 22.

Figure 2:
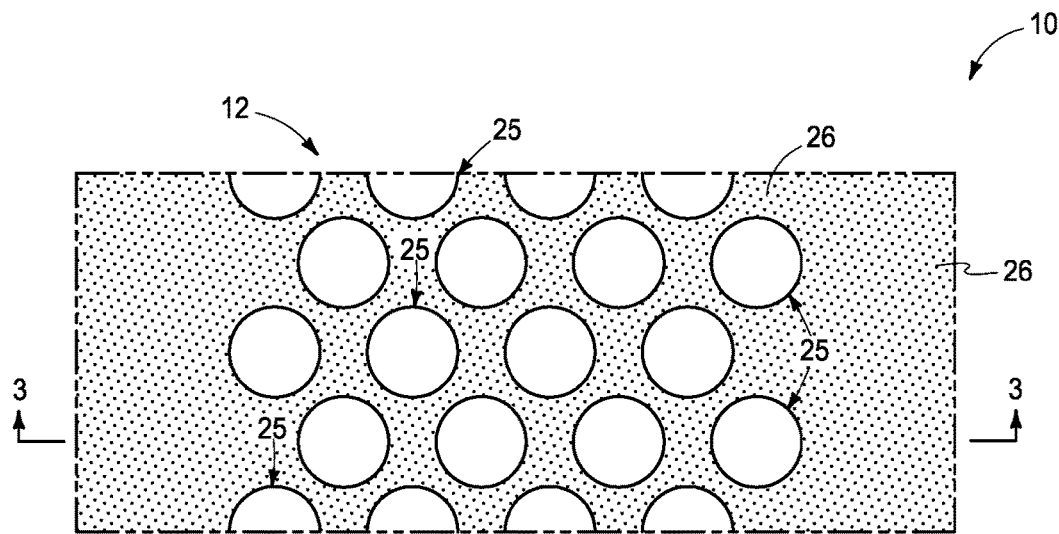
FIG. 2 is a view of the FIG. 1 substrate at a processing step subsequent to that shown by FIG. 1 and is taken through line 2-2 in FIG. 3.
Figure 3:
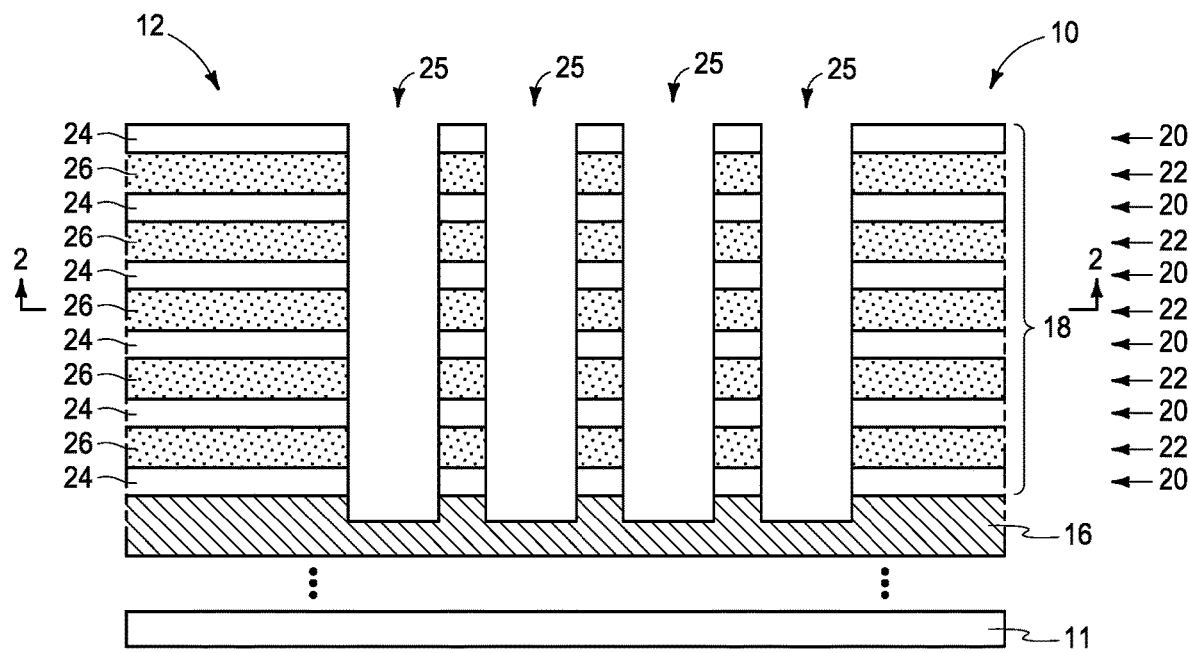
FIG. 3 is a view taken through line 3-3 in FIG. 2.

Referring to FIGS. 2 and 3, channel openings 25 have been formed (e.g., by dry anisotropic etching) into alternating tiers 20 and 22. By way of example only, channel openings 25 are shown as being arranged in groups or columns of staggered rows of four openings 25 per row. Any alternate existing or future-developed arrangement and construction may be used. Channel openings 25 may go into conductive material 16 as shown or may stop there-atop (not shown).

In one embodiment, transistor channel material is formed in the individual channel openings to extend elevationally through the insulative tiers and the wordline tiers, and individual memory, cells of the array are formed to comprise a gate region (e.g., a control-gate region) and a memory structure laterally between the gate region and the channel material. In one such embodiment, the memory structure is formed to comprise a charge-blocking region, charge-storage material, and insulative charge-passage material. The charge-storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the charge-storage material.

Figure 4:
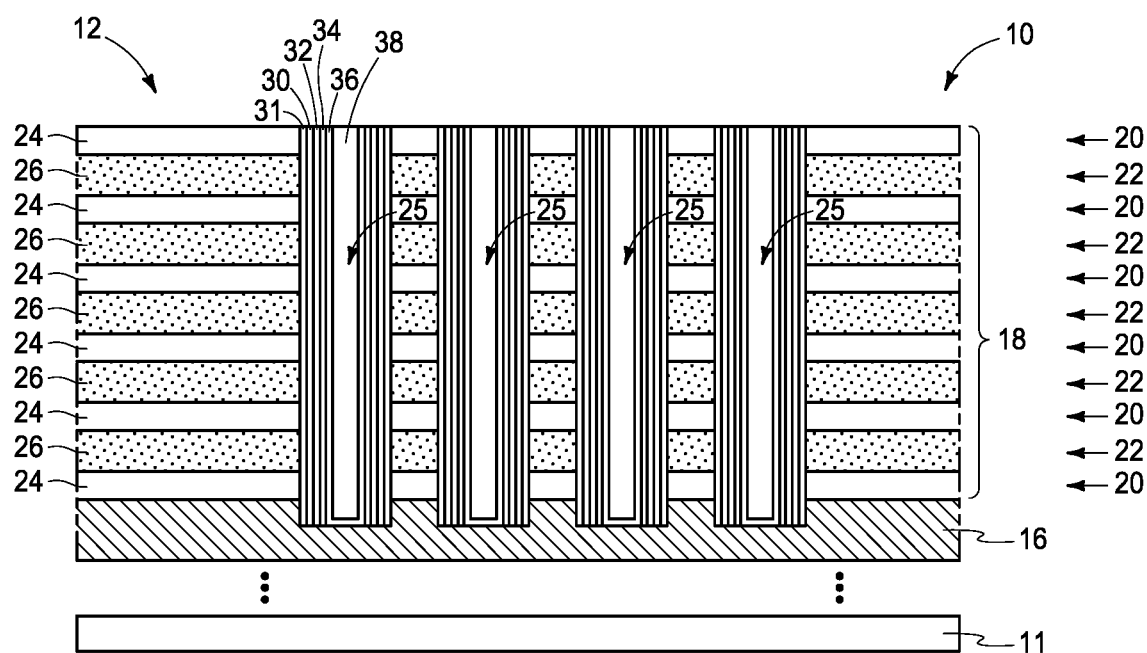
FIG. 4 is a view of the FIG. 3 substrate at a processing step subsequent to that shown by FIG. 3.

FIG. 4 shows one embodiment wherein charge-blocking material 31/30, charge-storage material 32, and charge-passage material 34 have been formed in individual channel openings 25 elevationally along insulative tiers 20 and wordline tiers 22. Transistor materials 31/30, 32 and 34 (e.g., memory cell materials) may be formed by, for example, deposition of respective thin layers thereof over stack 18 and within individual channel openings 25 followed by plagiarizing such back at least to an uppermost surface of stack 18. Punch etching may be conducted to remove materials 31/30, 32 and 34 from the bases of channel openings 25 to expose conductive material 16. Channel material 36 has then been formed in channel openings 25 elevationally along insulative tiers 20 and wordline tiers 22, Example channel materials 36 include appropriately-doped crystalline semiconductor material, such as one or more silicon, germanium, and so-called 111/V semiconductor materials (e.g., GaAs, InP, GaP, and GaN). Example thickness for each of materials 30, 32, 34, and 36 are 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 5:
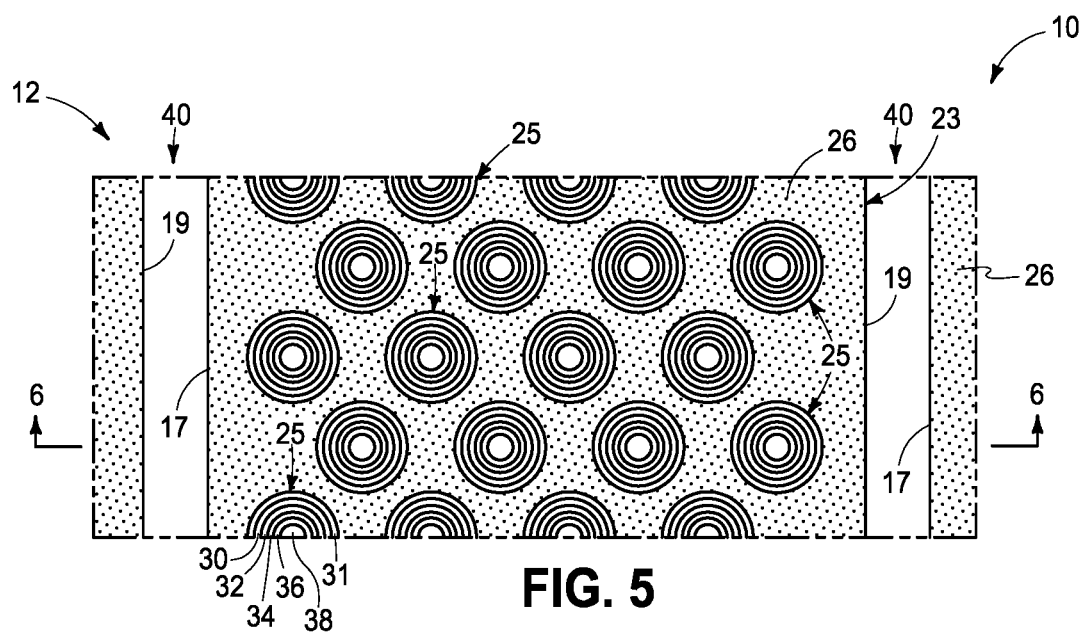
FIG. 5 is a view of the FIG. 4 substrate at a processing step subsequent to that shown by FIG. 4 and is taken through line 5-5 in FIG. 6.
Figure 6:
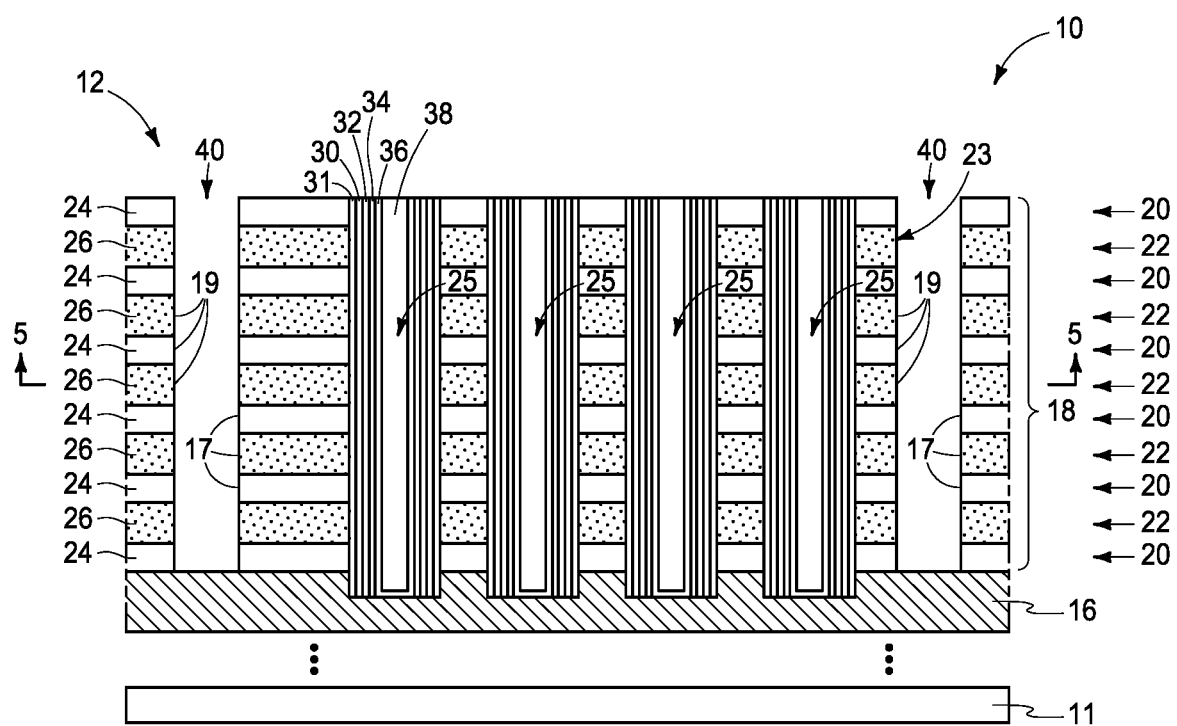
FIG. 6 is a view taken through line 6-6 in FIG. 5.

Referring to FIGS. 5 and 6, horizontally-elongated trenches 40 have been formed (e.g., by anisotropic etching) into stack 18 and in one embodiment to conductive material 16 (at least to material 16). Such, by way of example, has formed insulative tiers 20 and wordline tiers 22 to comprise opposing longitudinal edges 17, 19 (e.g., pairs of such edges) that together comprise longitudinal shape of longitudinal outlines 23 of individual wordlines to be formed in individual wordline tiers 22. Only one complete longitudinal outline 23 is shown with respect to two opposing longitudinal edges 17, 19, with only a partial longitudinal outline of two laterally-adjacent wordlines to be formed adjacent longitudinal outline 23 being visible with respect to one longitudinal edge 17 and one longitudinal edge 19. The wordlines to be formed may project laterally outward or be recessed laterally inward relative to longitudinal edges 17 and 19 as will be apparent from the continuing discussion.

Figure 7:
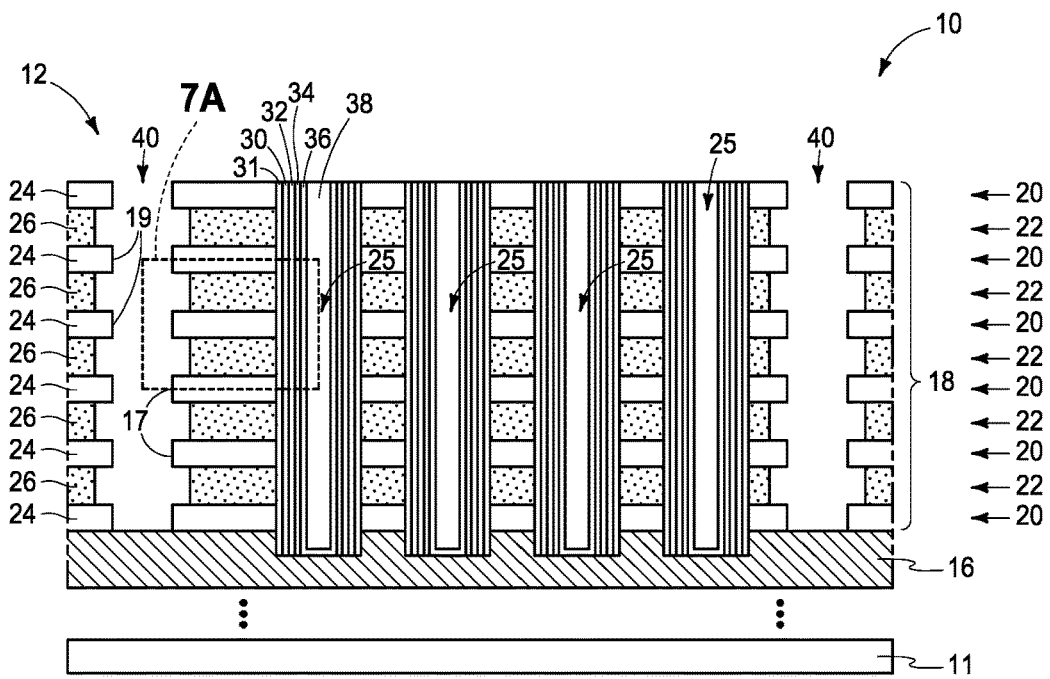
FIG. 7 is a view of the FIG. 5 substrate at a processing step subsequent to that shown by FIG. 5.
Figure 7A:
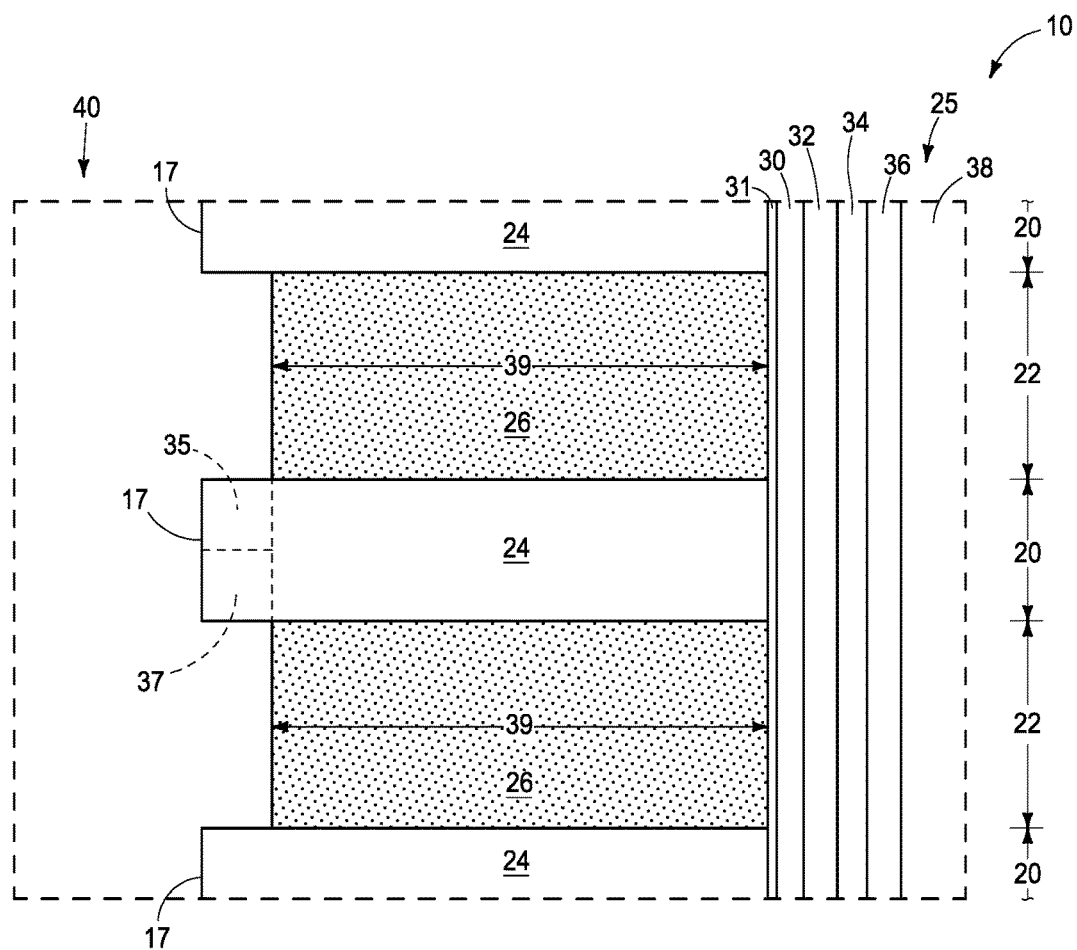
FIG. 7A is an enlarged view of a portion of FIG. 7.

Referring to FIGS. 7 and 7A, first sacrificial material 26 has been laterally recessed from opposing longitudinal edges 17, 19 of insulative tiers 20 and from second sacrificial material 24 thereof. Such may be conducted, for example, by timed etching (wet or dry and/or isotropically or anisotropically) and which may be conducted selectively relative to second material 24. Where, for example material 26 is silicon nitride and material 24 is silicon dioxide, an example etching chemistry is wet or dry phosphoric acid $H_3PO_4$.

Such may be consider as leaving remaining portions 39 of first material 26 and forming an exposed top portion 35 and an exposed bottom portion 37 of second material 24 at longitudinal edges 17, 19 of insulative tiers 20.

Figure 8:
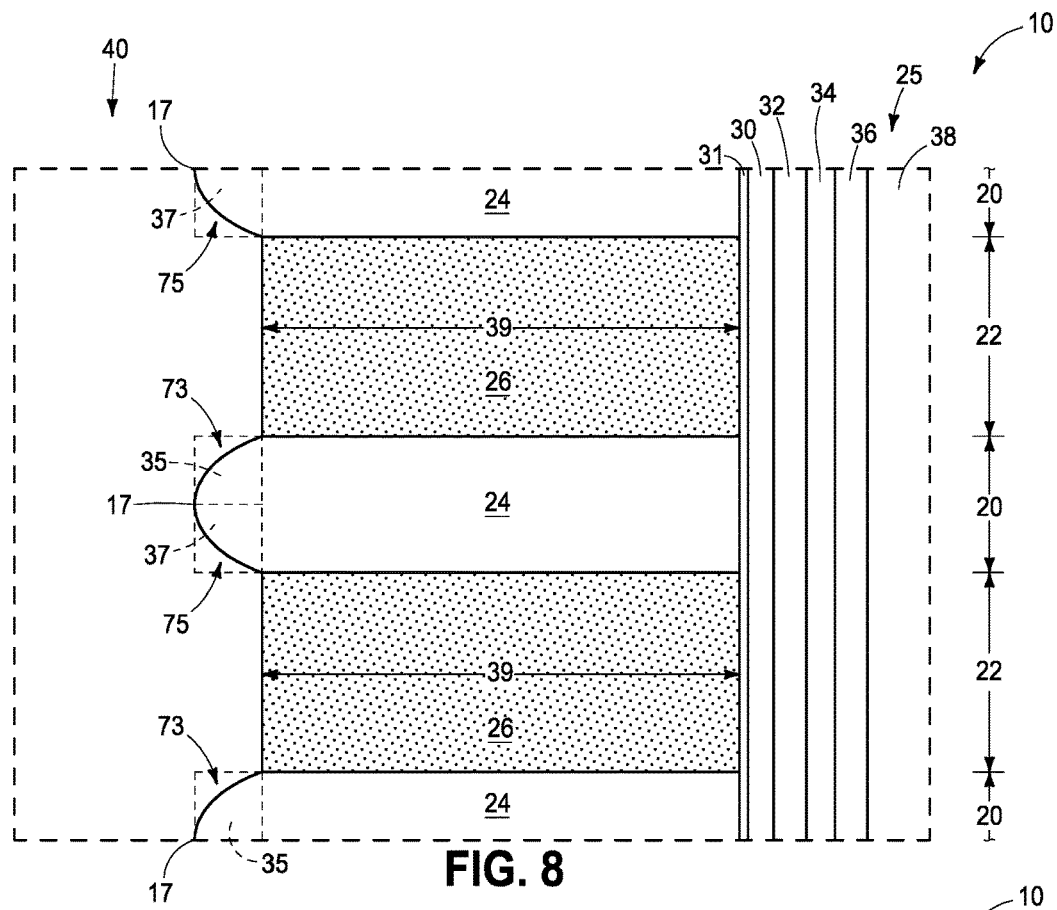
FIG. 8 is of the FIG. 7A substrate at a processing step subsequent to that shown by FIG. 7A.

Referring to FIG. 8, exposed top portion 35 and bottom portion 37 of second material 24 at longitudinal edges 17, 19 (edges 19 not being visible in FIG. 8, but would appear in mirror-image to that of FIG. 8) of insulative tiers 20 have been isotropically etched to form upper recesses 73 and lower recesses 75 in second sacrificial material 24. Remaining portions 39 of first material 26 mask second material 24 during and from such isotropic etching. In one embodiment and as shown, such etching may be conducted selectively relative to second material 24. Where, for example, second material 24 comprises silicon dioxide and first material 26 comprises silicon nitride, an example etching chemistry is HF. Second material 24 would likely also be at least slightly laterally recessed (not shown) from original edges 17 and 19.

Figure 9:
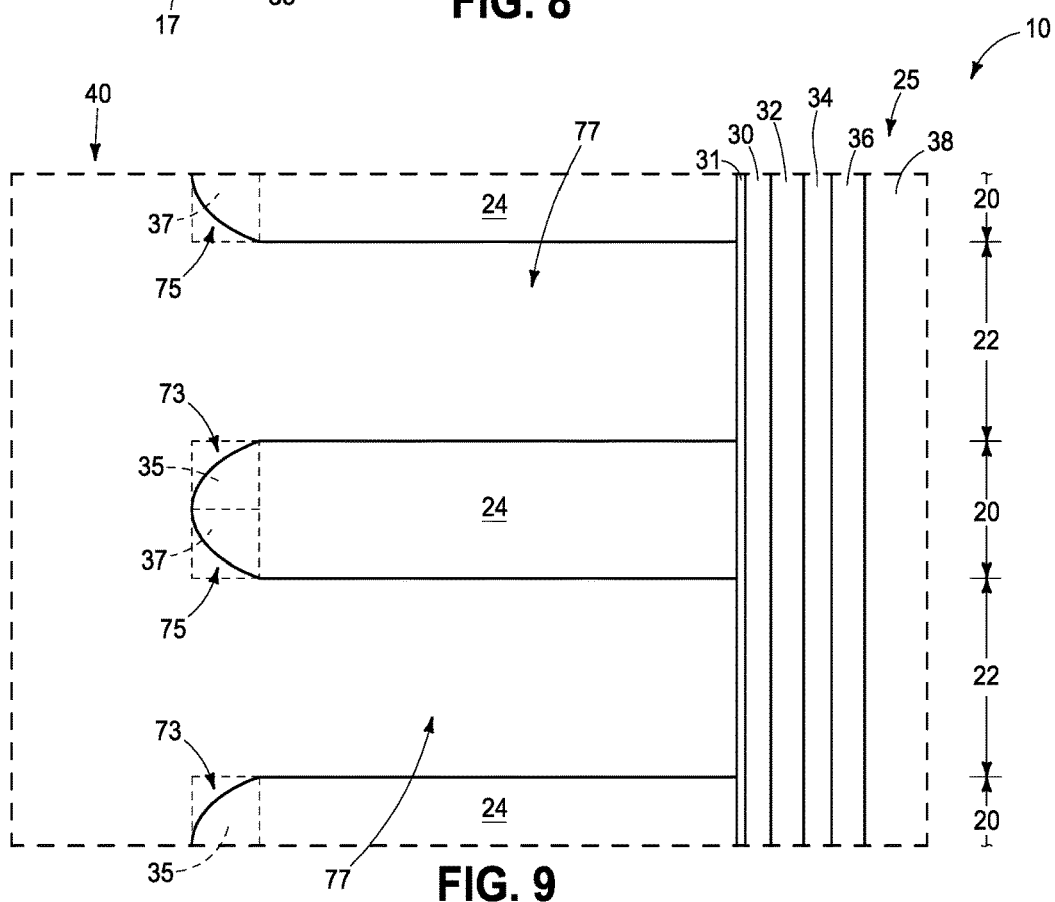
FIG. 9 is a view of the FIG. 8 substrate at a processing step subsequent to that shown by FIG. 8.

Referring to FIG. 9, first sacrificial material 26 (not shown) has been removed to form wordline-tier voids 77. In one embodiment and as shown, such act of removing has been conducted selectively relative to second material 24. An example technique is by selective isotropic etching, for example using liquid or vapor $H_3PO_4$.

Figure 10:
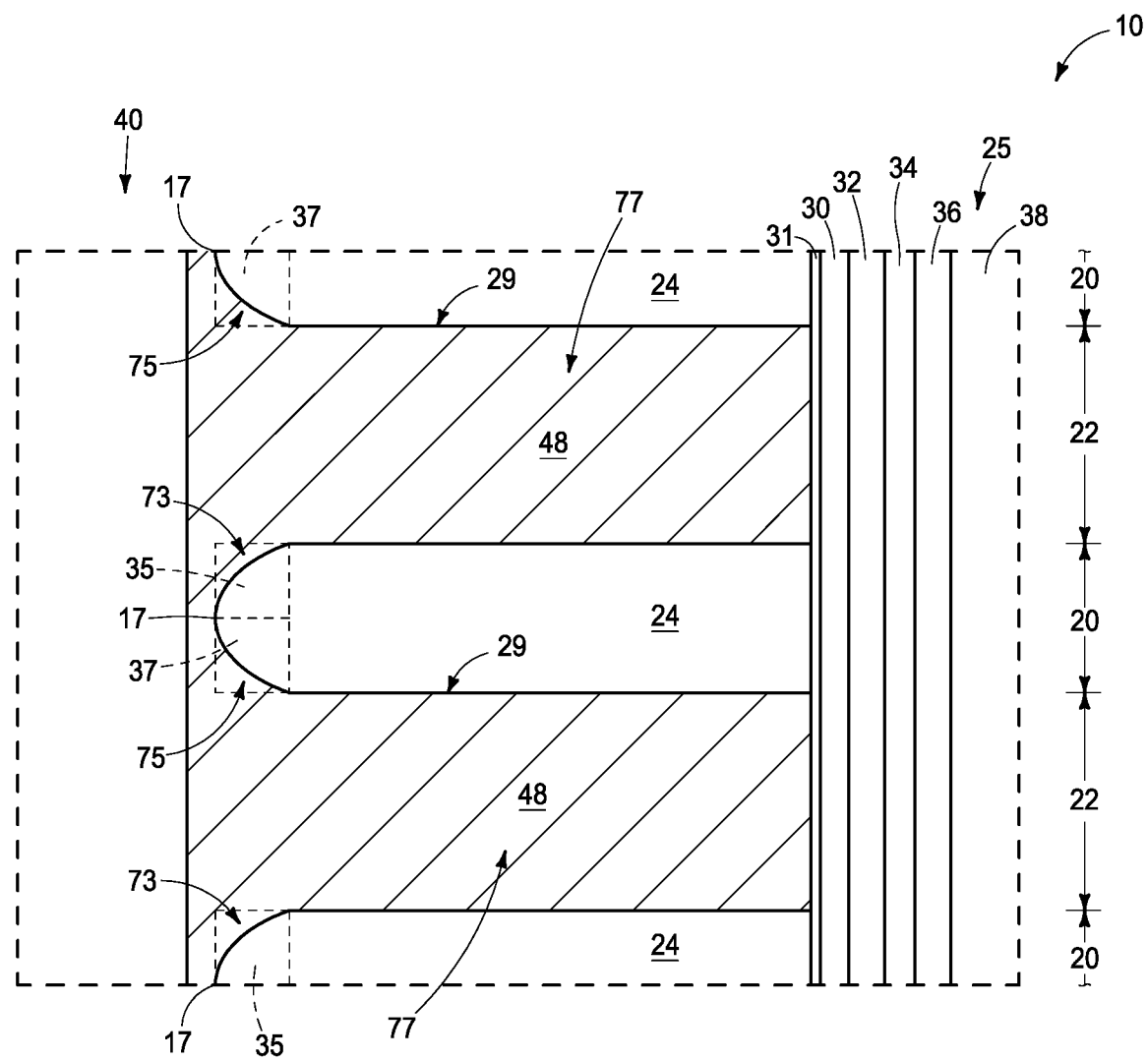
FIG. 10 is a view of the FIG. 9 substrate at a processing step subsequent to that shown by FIG. 9.

Referring to FIG. 10, conductive material 48 has been formed in wordline-tier voids 77 and in upper recesses 73 and in lower recesses 75. Conductive material 48 in upper recesses 73 and in lower recesses 75 projects downwardly and upwardly, respectively, into individual insulative tiers 20. In one embodiment and as shown, conductive material 48 covers opposing longitudinal edges 17, 19 (edges 19 not being visible in FIG. 10) of second material 24 of insulative materials 20. Conductive material 48 in wordline-tier voids 77 and in upper recesses 73 and lower recesses 75 comprise individual wordlines 29 (albeit shorted together at this point of the process if material 48 is laterally over edges 17 and 19). Any suitable conductive material may be used, for example one or both of metal material or conductively-doped semiconductor material.

Figure 11:
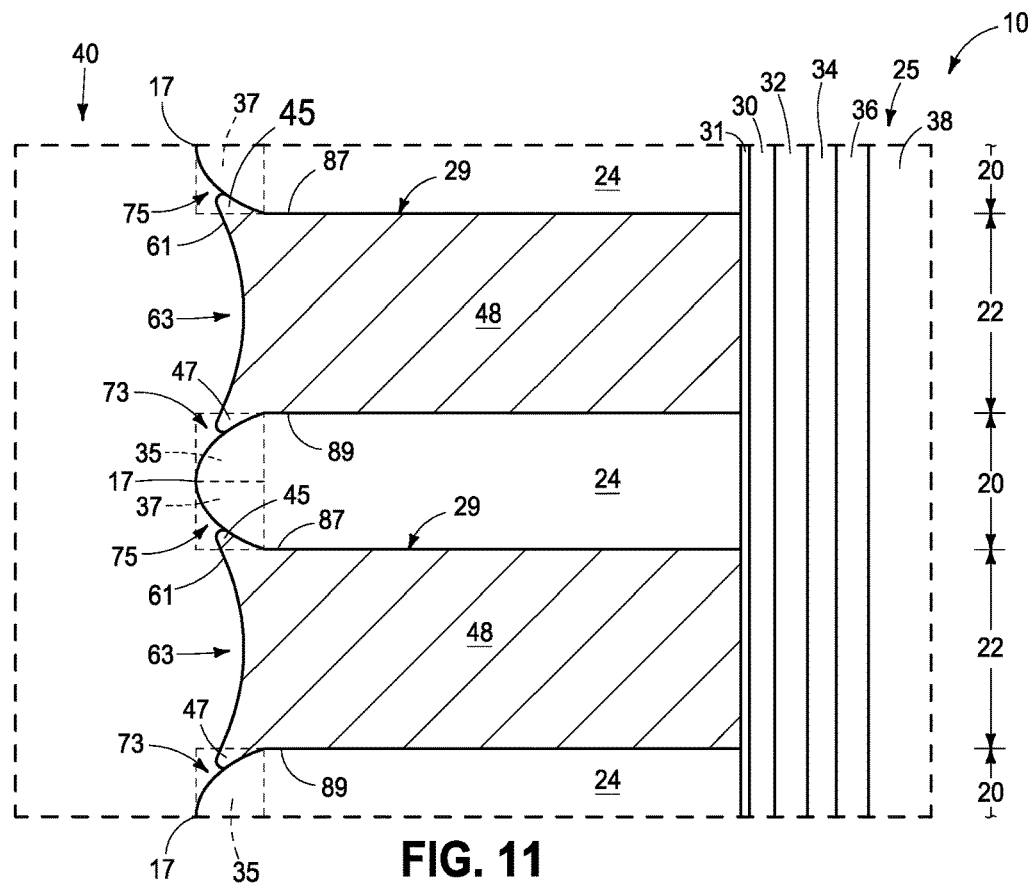
FIG. 11 is a view of the FIG. 10 substrate at a processing step subsequent to that shown by FIG. 10 and shown on one side of a channel opening.
Figure 12:
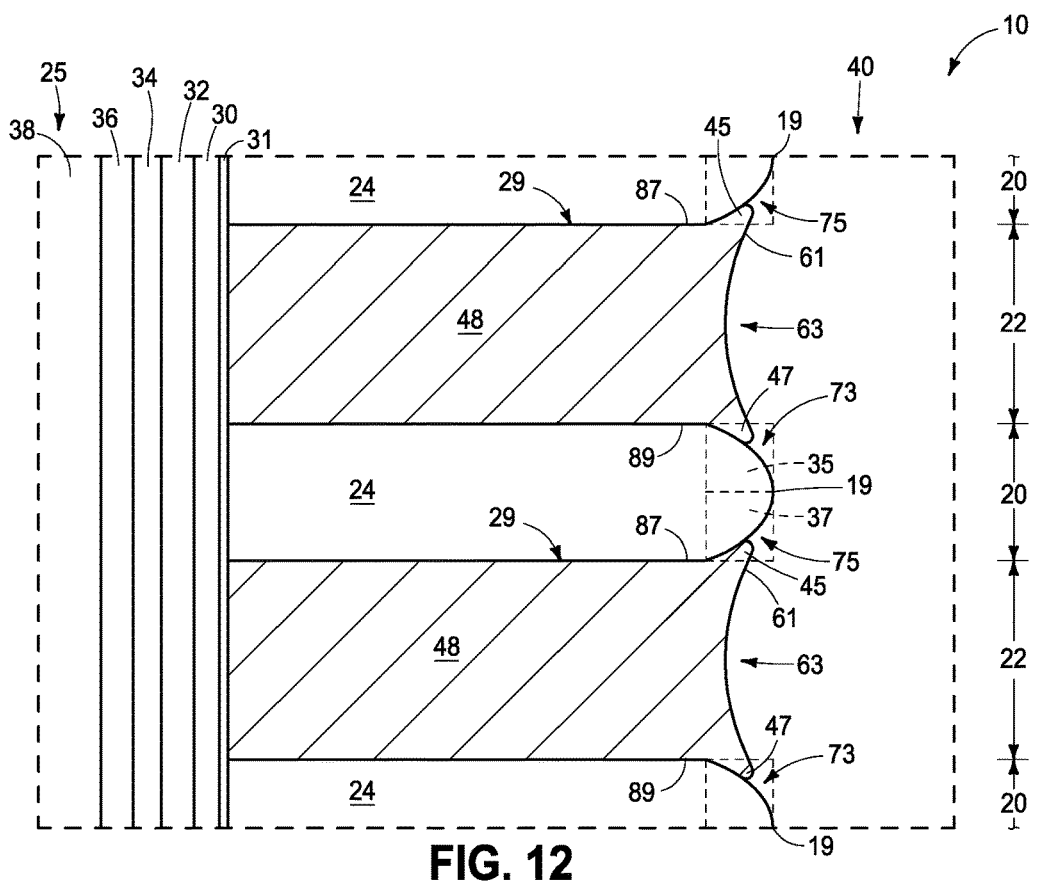
FIG. 12 is a view of the FIG. 11 substrate shown on a side of a channel opening that is opposite the one side of FIG. 11.

Referring to FIGS. 11 and 12, conductive material 48 has been laterally etched back to uncover opposing longitudinal edges 17 and 19 of second sacrificial material 24 of insulative tiers 20. Such may, for example, be conducted by any existing or future-developed isotropic wet or dry etching of conductive material 48 selectively relative to second material 24 of insulative tiers 20. In one embodiment and as shown, such laterally etching back forms individual wordlines 29 to comprise opposing laterally-outer longitudinal edges 61 individually comprising a longitudinally-elongated recess 63 (e.g., extending into and out of the plane of the page upon which FIGS. 11 and 12 lie) extending laterally (e.g., in the direction of the arrows designated with numerals 63) into the respective individual wordline 29. In one such embodiment and as shown, a deepest lateral extent of longitudinally-elongated recess 63 is vertically centered relative to the respective individual wordline 29 (e.g., between the depicted example top and bottom surfaces 87 and 89, respectively, of wordlines 29). Regardless, in one embodiment and as shown, some and only some of conductive material 48 has been removed from upper recesses 73 and from lower recesses 75. Where, for example, conductive material 48 comprises TiN and/or W and second material 24 comprises silicon dioxide, an example wet etching chemistry is a mixture of acetic acid, nitric acid, phosphoric acid, and water. In one embodiment, conductive material 48 may be considered as comprising an up-projection 45 projecting upwardly from an immediately-laterally-adjacent upper surface 87 and a down-projection 47 projecting downwardly from an immediately-laterally-adjacent lower surface 89.

Figure 13:
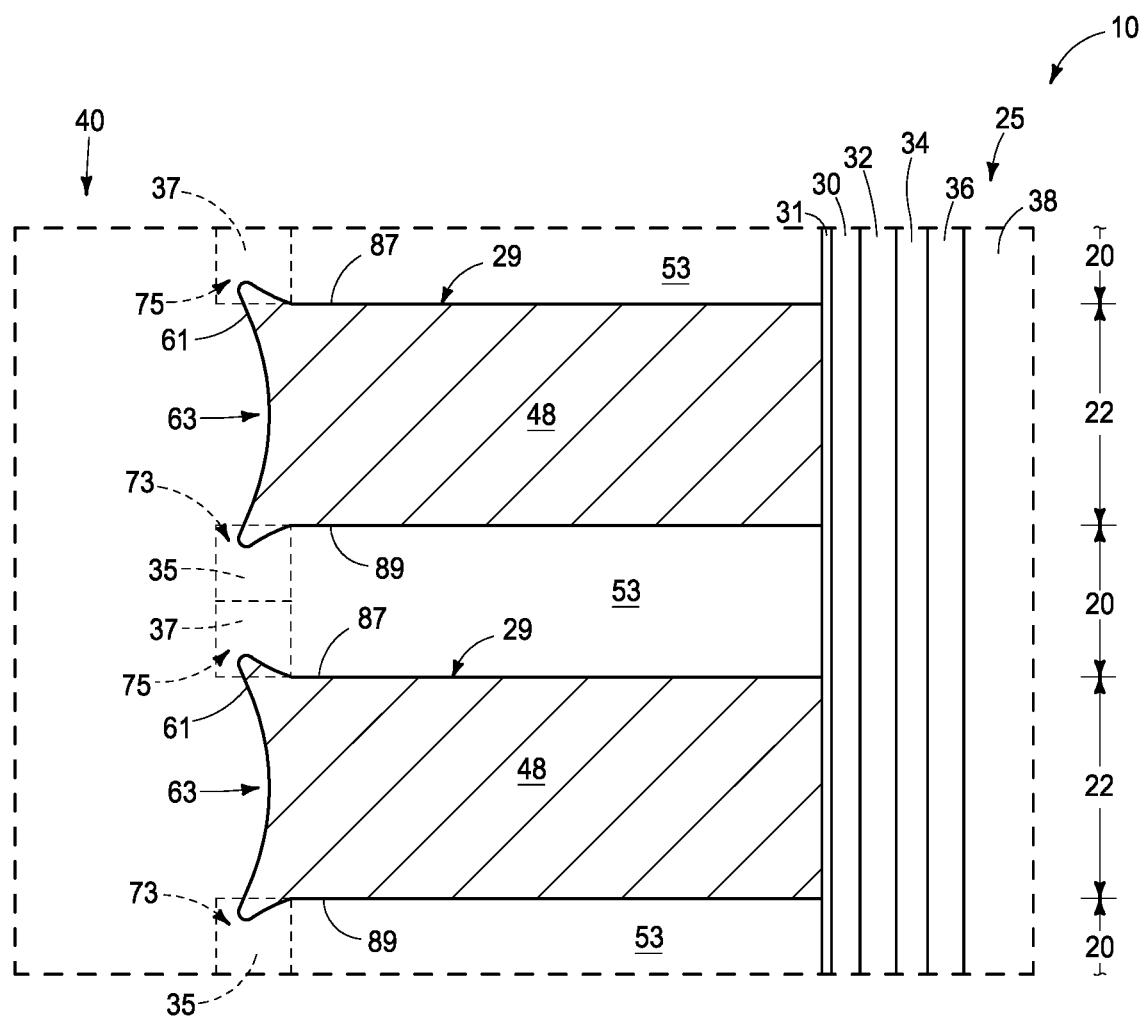
FIG. 13 is a view of the FIG. 11 substrate at a processing step subsequent to that shown by FIGS. 11 and 12.

Referring to FIG. 13, second material 24 (not shown) has been removed selectively relative to conductive material 48 to form insulative tiers 20 to individually comprise longitudinally-elongated voids 53 (e.g., extending into and out of the plane of the page upon which FIG. 13 lies). An example technique for doing so includes wet or dry isotropic etching, for example using liquid or vapor HF where second material 24 comprises silicon dioxide and conductive material 48 comprises metal material.

Figure 14:
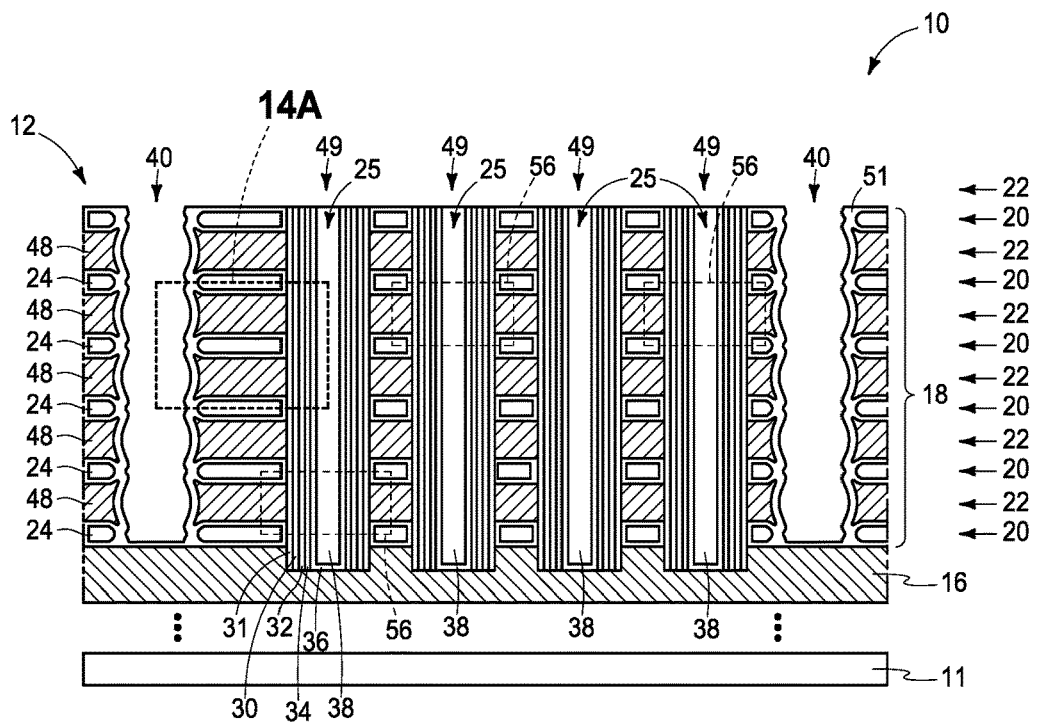
FIG. 14 is a view of the FIG. 13 substrate at a processing step subsequent to that shown by FIG. 13.
Figure 14A:
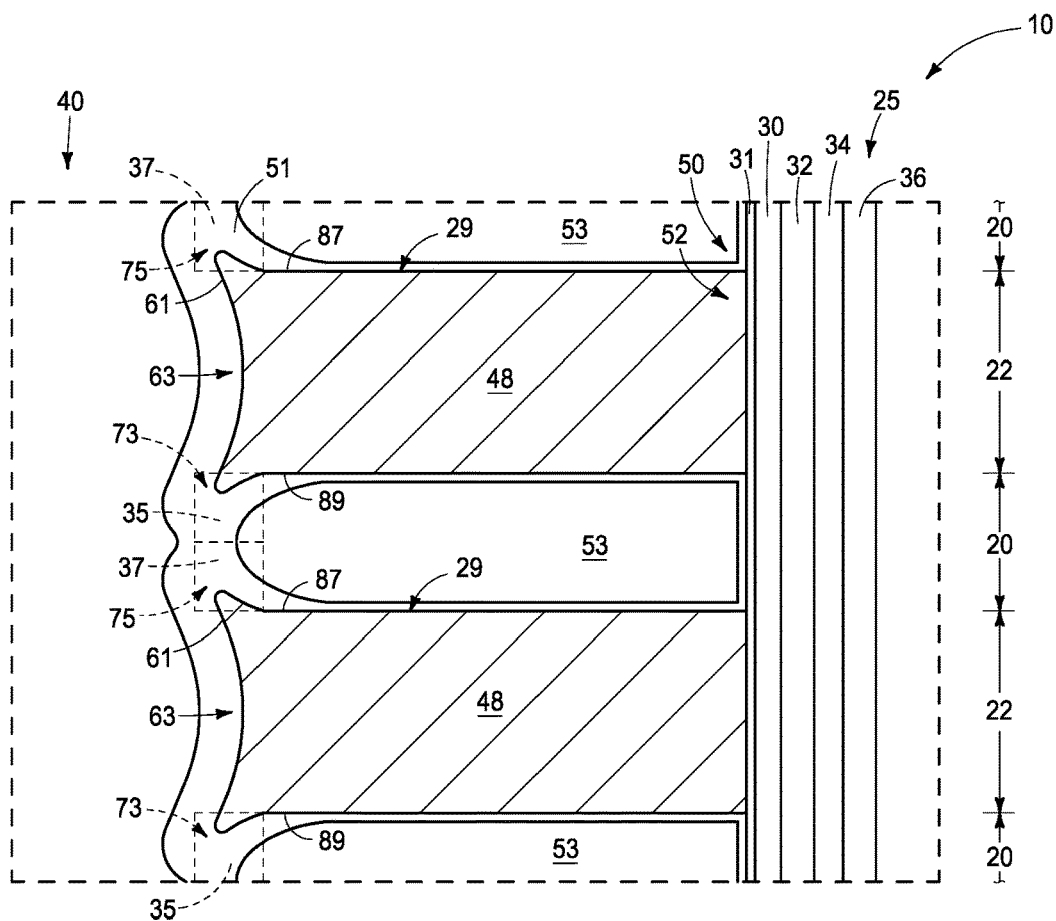
FIG. 14A is an enlarged view of a portion of FIG. 14.

Referring to FIGS. 14, and 14A, insulator material 51 (e.g., silicon nitride, silicon oxynitride, aluminum oxide, hafnium oxide, combinations of these, etc.) has been formed to extend elevationally completely between the upwardly and downwardly projecting portions of conductive material 48 that is in upper recess 73 and lower recess 75 of immediately vertically adjacent wordline tiers 22. In one embodiment, such seals-up longitudinally-elongated voids 53 (e.g., to form longitudinally-elongated and sealed voids 53). Where such sealed voids 53 are to be formed, forming of recesses 73 and 75 may facilitate the ability to form such sealed voids by precluding or minimizing other undesired processing artifacts that otherwise may hinder formation of such sealed voids.

Figure 15:
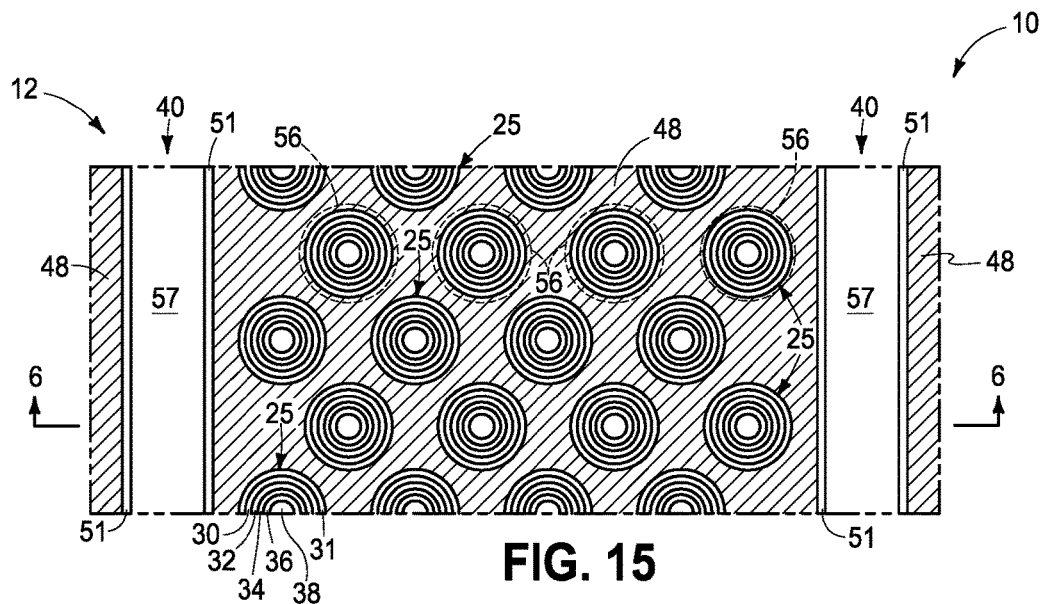
FIG. 15 is a view of the FIG. 14 substrate at a processing step subsequent to that shown by FIG. 14 and is taken through line 15-15 in FIG. 16.
Figure 16:
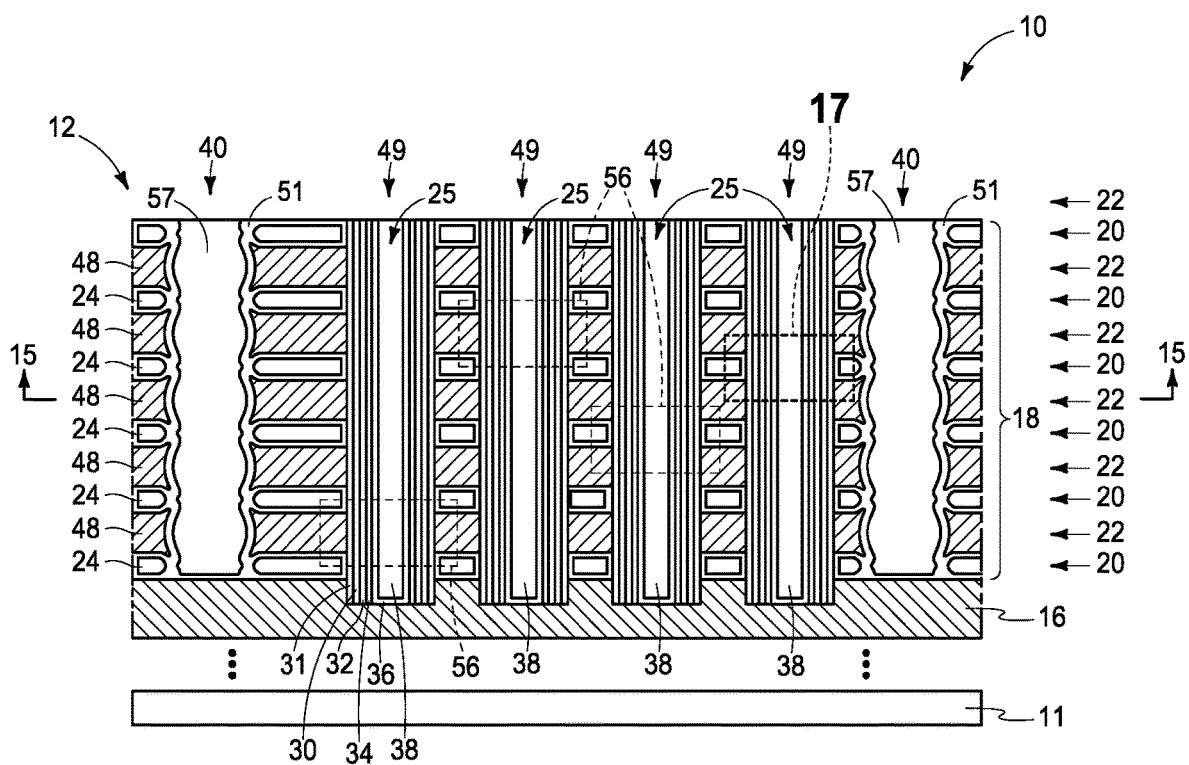
FIG. 16 is a view taken through line 16-16 in FIG. 15.
Figure 17:
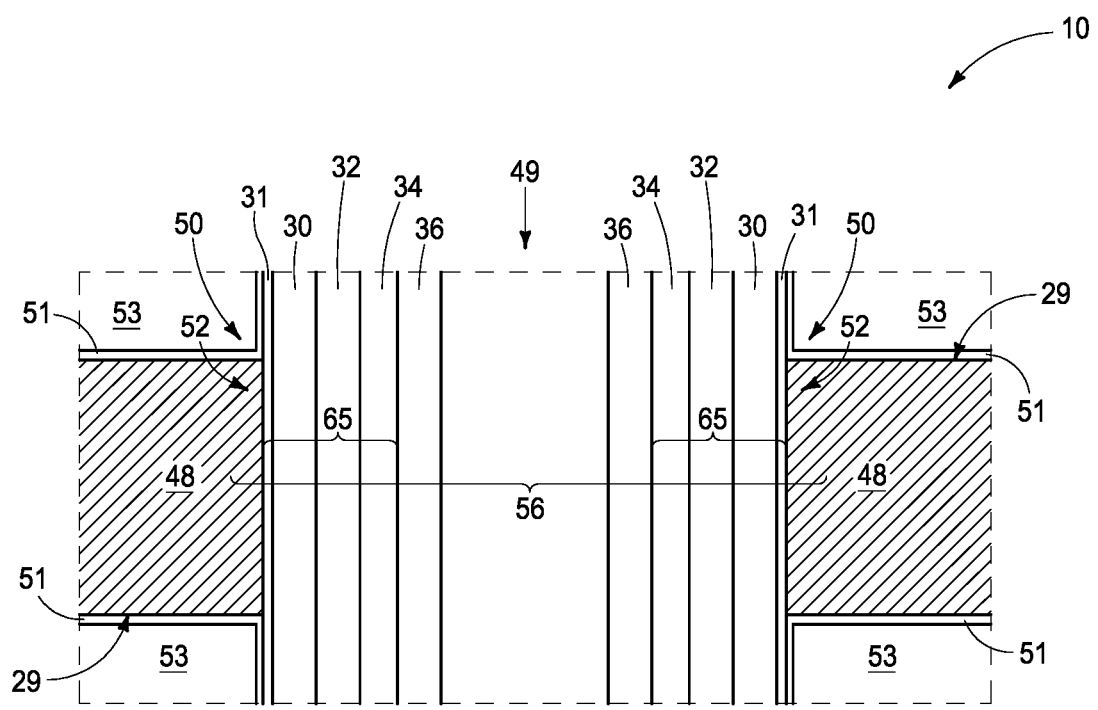
FIG. 17 is an enlarged view of a portion of FIG. 15.

Referring to FIGS. 15 and 16, another material 57 (dielectric and/or silicon-containing such as polysilicon) has been formed in individual trenches 40 elevationally along and spanning laterally between insulator material 51 therein.

Referring to FIGS. 14, 14A, and 15-17, wordlines 29 are part of elevationally-extending strings 49 of individual transistors and/or memory cells 56. Approximate locations of transistors and/or memory cells 56 are indicated with a bracket in FIG. 17 and some with dashed outlines in FIGS. 14, 15, and 16, with transistors and/or memory cells 56 being essentially ring-like or annular in the depicted example. Conductive material 48 may be considered as having terminal ends 50 (FIGS. 14A and 17) corresponding to control-gate regions 52 of individual transistors and/or memory cells 56. Control-gate regions 52 in the depicted embodiment comprise individual portions of individual wordlines 29. Materials 31/30, 32, and 34 may be considered as a memory structure 65 (FIG. 17) that is laterally between control-gate region 52 and channel material 36.

A charge-blocking region (e.g., charge-blocking material 31/30) is between charge-storage material 32 and individual control-gate regions 52. A charge block may have the following functions in a memory cell: in a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 31/30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48), Regardless, as an additional example, an interface of a charge-storage material and conductive material of a control gate may be sufficient to function as a charge-blocking region in the absence of any separate-composition-insulator material 31/30. Further, an interface of conductive material 48 with material 31/30 (when present) in combination with insulator material 31/30 may together function as a charge-blocking region, and as alternately or additionally may a laterally-outer region of an insulative charge-storage material (e.g., a silicon nitride material 32). An example material 31 is any hi-k material, for example silicon hafnium oxide or aluminum oxide. An example material 30 is silicon dioxide and/or silicon nitride.

Any other attribute(s) or aspect(s) as shown and/or described herein with respect to other embodiments may be used with respect to the above-described embodiments.

An embodiment of the invention encompasses a method used in forming a memory array (e.g., 12) comprising forming a stack (e.g., 18) comprising vertically-alternating insulative tiers (e.g., 20) and wordline tiers (e.g., 22). The insulative tiers and the wordline tiers comprise opposing longitudinal edges (e.g., 17, 19) comprising longitudinal shape of longitudinal outlines (e.g., 23) of individual wordlines (e.g., 29) to be formed in individual of the wordline tiers. The wordline tiers comprise a first material (e.g., 26) and the insulative tiers comprise a second material (e.g., 24) of different composition from that of the first material, A top portion (e.g., a part of portion 35) and a bottom portion (e.g., a part of portion 37) of second material 24 is removed at the longitudinal edges of the insulative tiers to form upper recesses (e.g., 73) and lower recesses (e.g., 75) in second material 24. Conductive material (e.g., 48) is formed in the upper and lower recesses. The conductive material projects upwardly and downwardly into individual of the insulative tiers and comprises a portion of the individual wordlines.

In one embodiment, all remaining of the first material is removed from the wordline tiers before forming the conductive material. In one embodiment, all remaining of the first material is removed from the wordline tiers after of the removing of the top portion and the bottom portion. In one embodiment, all remaining of the second material is removed from insulative tiers after forming the conductive material. In one embodiment, the individual wordlines are formed to comprise opposing laterally-outer longitudinal-edges (e.g., 61) individually comprising a longitudinally-elongated recess (e.g., 63) extending laterally into the respective individual wordline.

Any other attribute(s) or aspects) as shown and or described herein with respect to other embodiments may be used.

Embodiments of the invention encompass memory arrays independent of method of manufacture, Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises a vertical stack (e.g., 18) comprising alternating insulative tiers (e.g., 20) and wordline tiers (e.g., 22). The wordline tiers comprise gate regions (e.g., 52) of individual memory cells (e.g., 56). The gate regions individually comprise part of a wordline (e.g., 29) in individual of the wordline tiers. Channel material (e.g., 36) extends elevationally through the insulative tiers and the wordline tiers. The individual memory cells comprise a memory structure (e.g., 65) laterally between the gate region and the channel material. Individual of the wordlines comprise opposing laterally-outer longitudinal edges (e.g., 61). Such individually comprise a longitudinally-elongated recess (e.g., 63) extending laterally into the respective individual wordline. In one embodiment, a deepest lateral extent of the longitudinally-elongated recess is vertically centered relative to the respective individual wordline. In one embodiment, individual of the longitudinal edges project upwardly and downwardly into individual of the insulative tiers. In one embodiment, the insulative tiers individually comprise longitudinally-elongated voids (e.g., 53). In one such embodiment, the longitudinally-elongated voids are laterally-circumferentially surrounded by insulator material (e.g., 51). Such insulator material extends elevationally completely between upwardly and downwardly projecting portions of the longitudinal edges of immediately vertically adjacent of the wordlines. In one embodiment, the memory cell structure comprises a charge-blocking region (e.g., 31/30) elevationally along the individual gate regions. Charge-storage material (e.g., 32) is elevationally along individual of the charge-blocking regions. Insulative charge-passage material (e.g., 34) is laterally between the channel and the charge-storage material.

Any other attribute(s) or aspect(s) as shown and/or described herein with respect to other embodiments may be used.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be devotionally outward of the other (i.e., independent of whether there is any lateral overlap of the two stated regions/materials/components). Analogously, use of "under" not preceded by "directly" only requires that some portion of the stated region/material/component that is under the other be devotionally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s), Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a stack comprising vertically-alternating insulative tiers and wordline tiers. The insulative tiers and the wordline tiers comprising opposing longitudinal edges comprising longitudinal shape of longitudinal outlines of individual wordlines to be formed in individual of the wordline tiers. The wordline tiers comprising a first material. The insulative tiers comprise a second material of different composition from that of the first material. A top portion and a bottom portion of the second material at the longitudinal edges of the insulative tiers are removed to form upper and lower recesses in the second material. A conductive material is formed in the upper and lower recesses. The conductive material projects upwardly and downwardly into individual of the insulative tiers and comprises a portion of the individual wordlines.

In some embodiments, a method used in forming a memory array comprises forming a stack comprising vertically-alternating insulative tiers and wordline tiers. The insulative tiers and the wordline tiers comprise opposing longitudinal edges comprising longitudinal shape of longitudinal outlines of individual wordlines to be formed in individual of the wordline tiers. The wordline tiers comprise a first sacrificial material. The insulative tiers comprise a second material of different composition from that of the first sacrificial material. The first sacrificial material is laterally recessed from the opposing longitudinal edges of the insulative tiers and from the second material thereof. Exposed top and bottom portions of the second material at the longitudinal edges of the insulative tiers are isotropically etched to form upper and lower recesses in the second material. Remaining portions of the first sacrificial material mask the second material during and from the isotropically etching. The first sacrificial material is removed after the isotropically etching to form wordline-tier voids. Conductive material is formed in the wordline-tier voids and in the upper and lower recesses. The conductive material in the upper and lower recesses projects downwardly and upwardly, respectively, into individual of the insulative tiers. The conductive material in the wordline-tier voids and in the upper and lower recesses comprises the individual wordlines.

In some embodiments, a method used in forming a memory array comprises forming a stack comprising vertically-alternating insulative tiers and wordline tiers. The insulative tiers and the wordline tiers comprise opposing longitudinal edges comprising longitudinal shape of longitudinal outlines of individual wordlines to be formed in individual of the wordline tiers. The wordline tiers comprise a first sacrificial material. The insulative tiers and the opposing longitudinal edges thereof comprise a second sacrificial material of different composition from that of the first sacrificial material. The first sacrificial material is laterally recessed from the opposing longitudinal edges of the insulative tiers and from the second sacrificial material thereof. Exposed top and bottom portions of the second sacrificial material at the longitudinal edges of the insulative tiers are isotropically etched to form upper and lower recesses in the second sacrificial material, Remaining portions of the first sacrificial material mask the second sacrificial material during and from the isotropically etching. The first sacrificial material is removed selectively relative to the second sacrificial material after the isotropically etching to form wordline-tier voids. Conductive material is formed in the wordline-tier voids and in the upper and lower recesses. The conductive material in the upper and lower recesses projects downwardly and upwardly, respectively, into individual of the insulative tiers. The conductive material in the wordline-tier voids and in the upper and lower recesses comprise the individual wordlines. The conductive material covers the opposing longitudinal edges of the second sacrificial material of the insulative tiers. The conductive material is laterally etched back to uncover the opposing longitudinal edges of the second sacrificial material of the insulative tiers. The second sacrificial material is removed selectively relative to the conductive material to form the insulative tiers to individually comprise longitudinally-elongated voids. Insulator material is formed to extend elevationally completely between upwardly and downwardly projecting portions of the conductive material that is in the upper and lower recesses and to seal-up the longitudinally-elongated voids.

In some embodiments, a memory array comprises a vertical stack comprising alternating insulative tiers and wordline tiers. The wordline tiers comprise gate regions of individual memory cells. The gate regions individually comprise part of a wordline in individual of the wordline tiers. Channel material extends elevationally through the insulative tiers and the wordline tiers. The individual memory cells comprise a memory structure laterally between the gate region and the channel material. Individual of the wordlines comprise opposing laterally-outer longitudinal edges. The longitudinal edges individually comprise a longitudinally-elongated recess extending laterally into the respective individual wordline.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising:
    a vertical stack comprising alternating insulative tiers and wordline tiers, the wordline tiers comprising gate regions of individual memory cells, the gate regions individually comprising part of a wordline in individual of the wordline tiers;
    channel material extending elevationally through the insulative tiers and the wordline tiers;
    the individual memory cells comprising a memory structure laterally between the gate region and the channel material; and
    individual of the wordlines comprising opposing laterally-outer longitudinal edges, the laterally-outer longitudinal edges individually comprising a longitudinally-elongated recess that extends laterally inward into the respective individual wordline.

2. The memory array of claim 1 wherein a deepest lateral extent of the longitudinally-elongated recess is vertically centered relative to the respective individual wordline.

3. The memory array of claim 1 wherein individual of the longitudinal edges project upwardly and downwardly into individual of the insulative tiers.

4. The memory array of claim 3 comprising insulator material extending elevationally completely between upwardly and downwardly projecting portions of the longitudinal edges of immediately vertically adjacent of the wordline tiers.

5. The memory array of claim 1 wherein the insulative tiers individually comprise longitudinally-elongated voids.

6. The memory array of claim 5 wherein the longitudinally-elongated voids are laterally-circumferentially surrounded by insulator material, the insulator material extending elevationally completely between upwardly and downwardly projecting portions of the longitudinal edges of immediately vertically adjacent of the wordline tiers.

7. The memory array of claim 1 wherein the memory cell structure comprises:
    a charge-blocking region elevationally along the individual gate regions;
    charge-storage material elevationally along individual of the charge-blocking regions; and
    insulative charge-passage material laterally between the channel material and the charge-storage material.

8. The memory array of claim 1 wherein conductive material of the individual wordlines comprise an up-projection projecting upwardly from an immediately-laterally-adjacent upper surface of the conductive material and a down-projection projecting downwardly from an immediately-laterally-adjacent lower surface of the conductive material.

9. A memory array comprising:
    a vertical stack comprising alternating insulative tiers and wordline tiers, the wordline tiers comprising gate regions of individual memory cells, the gate regions individually comprising part of a wordline in individual of the wordline tiers the insulative tiers individually comprise longitudinally-elongated voids;
    channel material extending elevationally through the insulative tiers and the wordline tiers;
    the individual memory cells comprising a memory structure laterally between the gate region and the channel material, the memory structure comprising:
        a charge-blocking region elevationally along the individual gate regions;
        charge-storage material elevationally along individual of the charge-blocking regions; and
        insulative charge-passage material laterally between the channel material and the charge-storage material;
    individual of the wordlines comprising opposing laterally-outer longitudinal edges, the laterally-outer longitudinal edges individually comprising a longitudinally-elongated recess that extends laterally inward into the respective individual wordline, a deepest lateral extent of the longitudinally-elongated recess being vertically centered relative to the respective individual wordline, individual of the longitudinal edges projecting upwardly and downwardly into individual of the insulative tiers; and
    the longitudinally-elongated voids being laterally-circumferentially surrounded by insulator material, the insulator material extending elevationally completely between upwardly and downwardly projecting portions of the longitudinal edges of immediately vertically adjacent of the wordline tiers.

10. The memory array of claim 1 wherein the longitudinally-elongated recess has a laterally-outermost surface in a vertical cross-section extending from a top to a bottom of its wordline and that is curved from said top to said bottom.

11. The memory array of claim 1 wherein,
the longitudinally-elongated recess has a laterally-outermost surface in a vertical cross-section extending from a top to a bottom of its wordline and that is curved from said top to said bottom; and
a deepest lateral extent of the longitudinally-elongated recess is vertically centered relative to the respective individual wordline.

12. The memory array of claim 9 wherein the longitudinally-elongated recess has a laterally-outermost surface in a vertical cross-section extending from a top to a bottom of its wordline and that is curved from said top to said bottom.

13. A method used in forming a memory array, comprising:
forming a stack comprising vertically-alternating insulative tiers and wordline tiers, the insulative tiers and the wordline tiers comprising opposing longitudinal edges comprising longitudinal shape of longitudinal outlines of individual wordlines to be formed in individual of the wordline tiers, the wordline tiers comprising a first sacrificial material, the insulative tiers and the opposing longitudinal edges thereof comprising a second sacrificial material of different composition from that of the first sacrificial material;
laterally recessing the first sacrificial material from the opposing longitudinal edges of the insulative tiers and from the second sacrificial material thereof;
isotropically etching exposed top and bottom portions of the second sacrificial material at the longitudinal edges of the insulative tiers to form upper and lower recesses in the second sacrificial material, remaining portions of the first sacrificial material masking the second sacrificial material during and from the isotropically etching;
removing the first sacrificial material selectively relative to the second sacrificial material after the isotropically etching to form wordline-tier voids;
forming conductive material in the wordline-tier voids and in the upper and lower recesses, the conductive material in the upper and lower recesses projecting downwardly and upwardly, respectively, into individual of the insulative tiers, the conductive material in the wordline-tier voids and in the upper and lower recesses comprising the individual wordlines, the conductive material covering the opposing longitudinal edges of the second sacrificial material of the insulative tiers;
laterally etching back the conductive material to uncover the opposing longitudinal edges of the second sacrificial material of the insulative tiers;
removing the second sacrificial material selectively relative to the conductive material to form the insulative tiers to individually comprise longitudinally-elongated voids;
forming insulator material to extend elevationally completely between upwardly and downwardly projecting portions of the conductive material that is in the upper and lower recesses and to seal-up the longitudinally-elongated voids; and
the laterally etching back forming the individual wordlines to comprise opposing laterally-outer longitudinal edges individually comprising a longitudinally-elongated recess extending laterally into the respective individual wordline.

* * * * *